United States Patent
Takayanagi

(10) Patent No.: US 8,800,139 B2
(45) Date of Patent: Aug. 12, 2014

(54) METHOD OF CHIP MOUNTING ONTO DOWNWARDLY-FACING MOUNTING SURFACE OF PRINTED CIRCUIT BOARD

(75) Inventor: Makoto Takayanagi, Shizuoka (JP)

(73) Assignee: Trinc.Org, Shizuoka-prefecture (JP)

( * ) Notice: Subject to any disclaimer, the term of this patent is extended or adjusted under 35 U.S.C. 154(b) by 0 days.

(21) Appl. No.: 13/333,145

(22) Filed: Dec. 21, 2011

(65) Prior Publication Data

US 2012/0110840 A1 May 10, 2012

Related U.S. Application Data

(62) Division of application No. 12/105,639, filed on Apr. 18, 2008, now abandoned.

(30) Foreign Application Priority Data

Nov. 1, 2007 (JP) .................................. 2007-284872

(51) Int. Cl.
*H05K 3/30* (2006.01)
*H05K 13/04* (2006.01)
(52) U.S. Cl.
CPC .................................. *H05K 13/0417* (2013.01)
USPC ..................... 29/832; 29/834; 29/833; 29/739

(58) Field of Classification Search
USPC .......... 29/739–742, 832–834; 414/737, 752.1
See application file for complete search history.

(56) References Cited

U.S. PATENT DOCUMENTS

| | | | | |
|---|---|---|---|---|
| 4,915,565 A | * | 4/1990 | Bond et al. | 29/740 |
| 5,094,381 A | * | 3/1992 | Amos et al. | 228/6.2 |
| 5,249,349 A | * | 10/1993 | Kuinose et al. | 29/721 |
| 6,055,724 A | * | 5/2000 | Nishino et al. | 29/855 |
| 6,467,158 B1 | * | 10/2002 | Kiyomura et al. | 29/740 |
| 7,020,953 B2 | * | 4/2006 | Ueno et al. | 29/740 |
| 7,028,392 B1 | * | 4/2006 | Schiebel | 29/740 |
| 7,278,203 B2 | * | 10/2007 | Aoyama et al. | 29/740 |
| 7,669,317 B2 | * | 3/2010 | Makino et al. | 29/832 |
| 7,827,677 B2 | * | 11/2010 | Ueno et al. | 29/740 |
| 2007/0039686 A1 | * | 2/2007 | Makino et al. | 156/249 |

* cited by examiner

*Primary Examiner* — Minh Trinh
(74) *Attorney, Agent, or Firm* — Leighton K. Chong

(57) ABSTRACT

A method of chip mounting uses a manipulator to mount an electronic component in a vertically upward direction onto a downwardly-facing mounting surface of a printed circuit board held by a holding bed. The holding bed is located above the manipulator or sidewise relative to the manipulator for mounting by the manipulator onto the downwardly-facing mounting surface of the printed circuit board.

3 Claims, 3 Drawing Sheets

METHOD OF CHIP MOUNTING ONTO DOWNWARDLY-FACING MOUNTING SURFACE OF PRINTED CIRCUIT BOARD

This is a divisional patent application claiming the priority of co-pending U.S. patent application Ser. No. 12/105,639 filed Apr. 18, 2008, of the same title.

TECHNICAL FIELD

This invention relates to a chip mounter for mounting electronic components or chips on a printed board.

BACKGROUND OF INVENTION

FIG. 4 is a diagrammatic view showing the construction and operation of a conventional chip mounter. As shown in FIG. 4 a conventional chip mounter 10 mounts electronic components or chips 12 on a print-circuit board (PCB) or printed board 18 horizontally located on a bed 16 comprising, for example, a conveyer.

The chips 12 are picked up, one at a time, from an electronic component feeding device or chip feeding device 14 in which chips are disposed at the leading end of tapes, transferred, and located in position above a printed board by a manipulator. The manipulator comprises a head 22 and a cable rack chain 24 for moving the head 22 horizontally and at the same time transferring electric power and signals. At that time, the head 22 having a moving range as shown by arrow A picks up the chip 12 at the position as shown by arrow 22a, thereafter is moved horizontally, and mounts the chip 12 on the printed board 18 at the position as shown by arrow 22b.

Since these operations are carried out in a space above the printed board, the foreign materials 20 such as dust or the like emanated from working parts and power feeding portion of manipulator of chip mounter fall down and are accumulated on the upper surface of the printed board.

Conventionally, since the electronic components were large in size, compared with the foreign materials 20 such as dust or the like, there was no problem. However, recently, since the electronic components are miniaturized very much, interference by the foreign materials 20 has been caused. For example, as shown in FIG. 5, when the foreign material 20 such as dust or the like which are large to a degree that interference may be caused are intervened between the electrode 12a of, for example, 0.1 mm in length of the electronic component 12 of, for example, 0.4 mm in length and the electrode 18a of, for example, 0.1 mm in length of the printed board 18, the defect in soldering would occur.

Therefore, it is an object of the present invention to provide a chip mounter which can inhibit accumulation of the foreign materials such as dust or the like to prevent the defect in soldering.

SUMMARY OF INVENTION

To accomplish the object, there is provided a chip mounter which comprises a manipulator for picking up an electronic component from an electronic component feeding device, transferring the electronic component to the electronic component mounted surface of a printed board, and mounting the electronic component on the electronic component mounted surface, and a bed located above said manipulator or located sidewise relative to said manipulator for mounting said printed board vertically or downwardly.

Other objects, features, and advantages of the present invention will be explained in the following detailed description of the invention having reference to the appended drawings:

BRIEF DESCRIPTION OF DRAWINGS

FIG. 3 is a view for explaining about the second embodiment in more detail.

DETAILED DESCRIPTION OF THE INVENTION

First Embodiment

Figure 1:
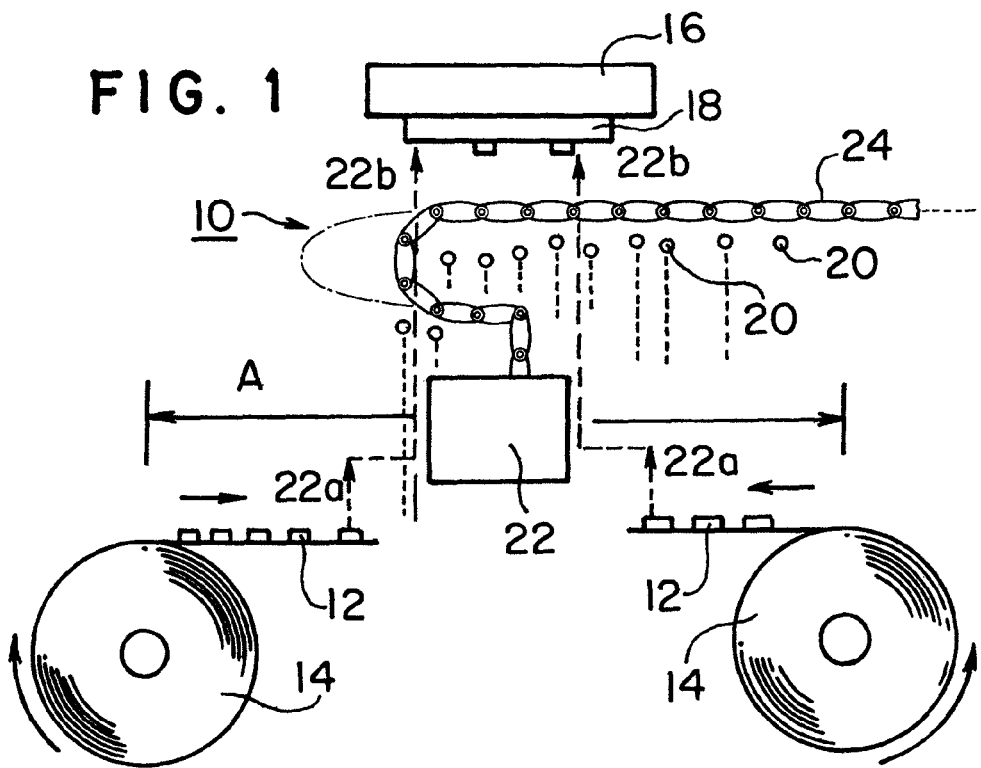
FIG. 1 is a view showing a first embodiment of chip mounter according to the present invention.

FIG. 1 is a view showing a first embodiment of chip mounter according to the present invention. As shown in FIG. 1 a bed 16 is disposed above a cable rack chain 24 of manipulator and a printed board 18 is mounted on the lower surface of bed 16. Electronic components or chips 12 are picked up, one at a time, by the manipulator from a chip feeding device 14 in which chips 12 are disposed on tapes. Thereafter by the manipulator the chip is transferred and located in position below the lower surface of printed board 18. At that time, a head 22 having a moving range shown by arrow A picks up the chip 12 at the position shown by arrow 22a, thereafter moves horizontally, and applies the chip 12 on the lower surface of printed board 18 at the position shown by arrow 22b.

Foreign materials 20 such as dust or the like falling down from the working parts of the chip mounter or foreign materials 20 such as dust or the like floating in the space above the bed 16 are not accumulated on the printed board 18, and therefore the defect in soldering can be avoided.

Second Embodiment

Figure 2:
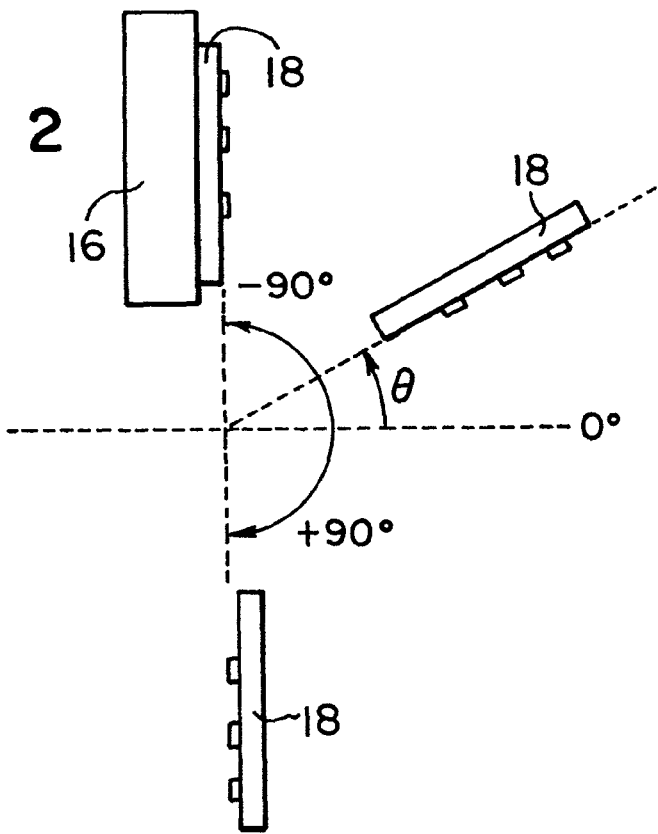
FIG. 2 is a view for explaining about a method in which chips are mounted on a printed board as a second embodiment of a chip mounter according to the present invention.

FIG. 2 is a view for explaining about a method in which chips are mounted on a printed board as a second embodiment of a chip mounter according to the present invention. As shown in FIG. 2, the printed board 18 is mounted on the bed 16 which is vertically disposed, or the bed 16 is disposed within a range of angle θ of −90 degree to +90 degree relative to horizontal axis and the printed board 18 is mounted downward on the bed 16. Under these circumstances the printed board 18 is disposed vertically or downward. Since the dust or the like falls down, the dust or the like is not accumulated on the printed board 18. Furthermore, in case that θ is equal to 0 degree, the second embodiment corresponds to the first embodiment.

Figure 3A:
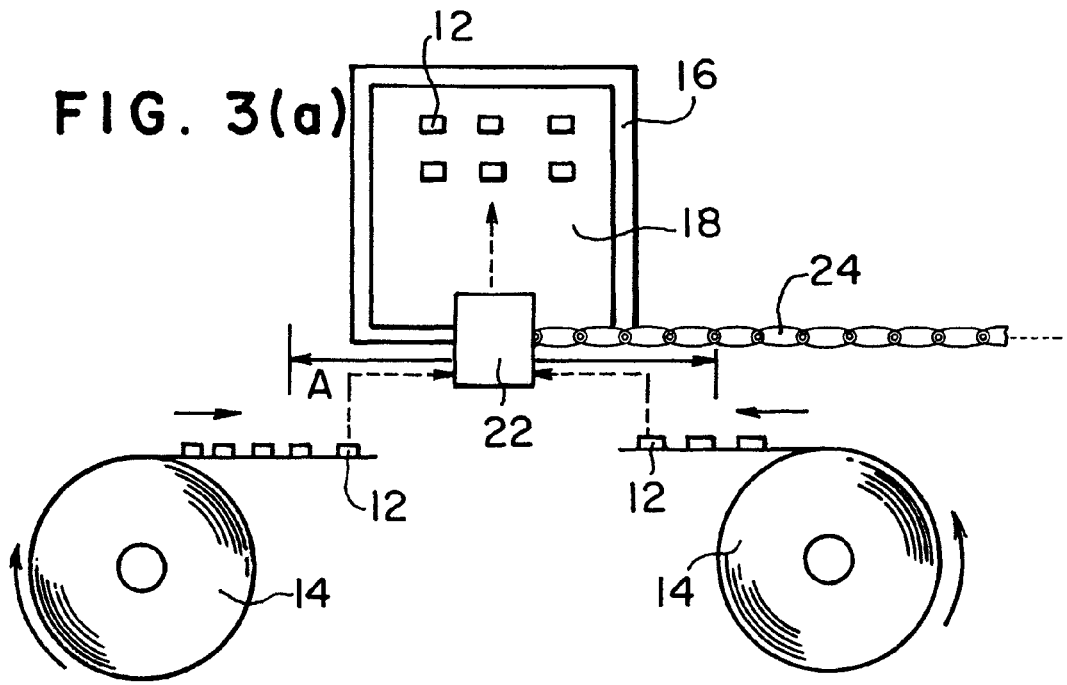
FIG. 3a is its front view and FIG. 3b is its side view.
Figure 3B:
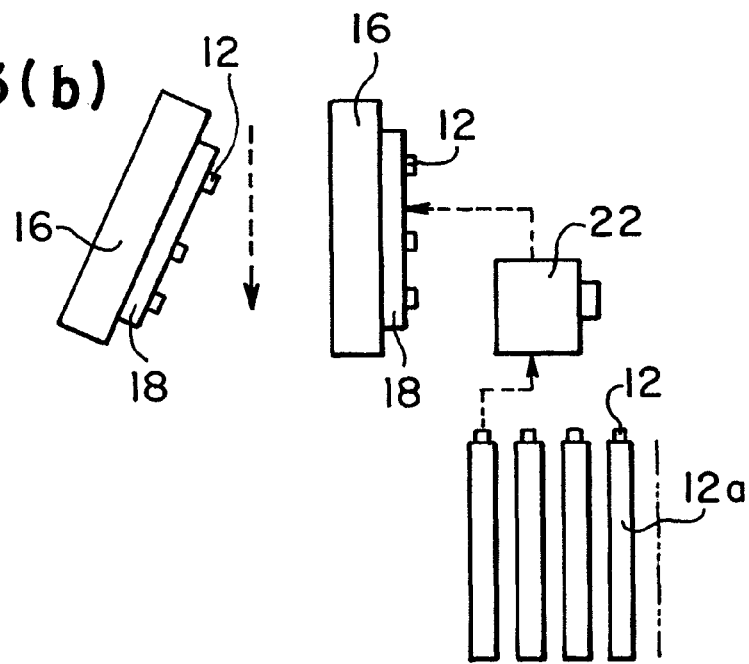
Figure 4:
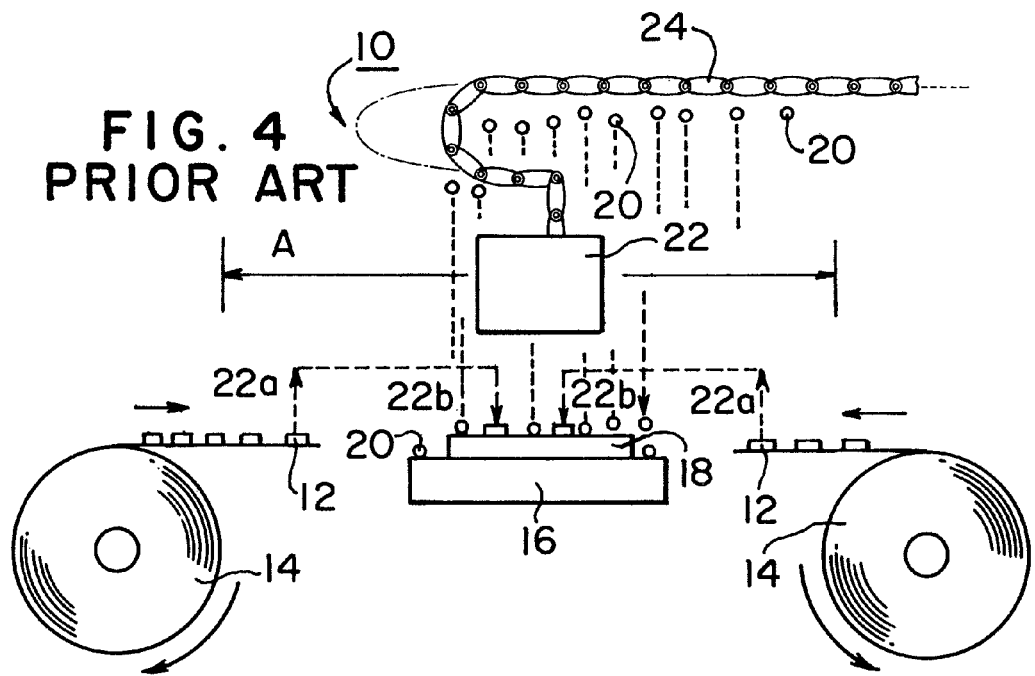
FIG. 4 is a diagrammatic view showing the construction and operation of a conventional chip mounter.
Figure 5A:
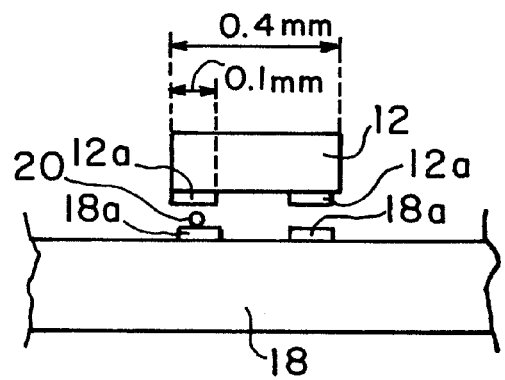
FIG. 5 is a view for explaining about occurrence of the defect in soldering in a conventional chip mounter.
Figure 5B:
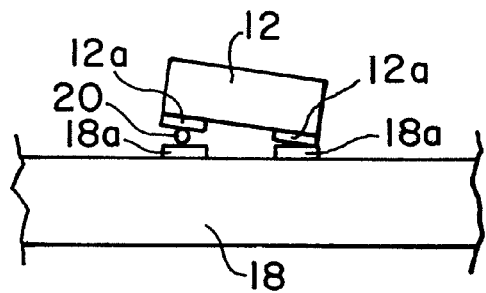

FIG. 3 is a view for explaining about the second embodiment in more detail, FIG. 3a is its front view and FIG. 3b is its side view. As shown in FIG. 3, the printed board 18 mounted on the bed 16 is installed so that its chip mounted surface is vertically or slightly downward. The working parts of the chip mounter or manipulator, that is, the head 22 and the cable rack chain 24 are located sidewise or downward relative to the printed board 18, not located above the printed board. Since the working parts is not located above the printed board, the dust or the like is not accumulated on the printed board 18. Furthermore, the chip 12 is located on the leading end of tape 12a.

Since in the cases of these embodiments, the chip mounted surface of the printed board is vertical or downward, it is preferable that the adhesive, force of which is strong to such a degree that it can hold the chip before hardening to prevent falling down of the chip is used.

Since in the cases of these embodiments, the chip mounted surface of the printed board is vertical or downward, it is preferable that the adhesive is hardened or half hardened just before or just after mounting of the chip.

It is understood that many modifications and variations may be devised given the above description of the principles of the invention. It is intended that all such modifications and variations be considered as within the spirit and scope of this invention, as it is defined in the following claims.

The invention claimed is:

1. A method for mounting an electronic component on a mounting surface of a printed circuit board comprising:

moving a manipulator laterally in a horizontal direction and in a vertically downward direction for picking up an electronic component from an electronic component feeding device on a horizontal surface so that the electronic component is received in the manipulator from below, and then moving the manipulator holding the electronic component upwardly in a vertical direction to a printed circuit board located vertically above the manipulator, providing holding means located above the manipulator for holding the printed circuit board in the vertical direction above the manipulator and with a mounting surface of the printed circuit board facing vertically downward or at an inclined angle downward toward the manipulator, receiving the electronic component held by the upwardly moving manipulator on the mounting surface of the printed circuit board held by the holding means so that its mounting surface is facing vertically downward or at an inclined angle downward, and thereby enabling any debris from mounting electronic components on the printed circuit board to fall off under gravity due to the mounting of the electronic component by the manipulator being moved vertically upward toward the mounting surface of the printed circuit board facing vertically downward or at an inclined angle downward toward the manipulator.

2. The method according to claim 1 further comprising applying an adhesive to hold an electronic component to the printed circuit board, the adhesive having an adhesive force such that the electronic component does not fall down from the printed circuit board before the adhesive hardens.

3. The method according to claim 1 further comprising applying an adhesive to hold an electronic component to the printed circuit board, the adhesive being hardened or half hardened just before or just after mounting the electronic component to the printed circuit board in order to prevent it from falling down.

* * * * *